(12) United States Patent
Delano et al.

(10) Patent No.: US 6,297,697 B2
(45) Date of Patent: Oct. 2, 2001

(54) METHODS AND APPARATUS FOR NOISE SHAPING A MIXED SIGNAL POWER OUTPUT

(75) Inventors: Cary L. Delano; Adya S. Tripathi, both of San Jose, CA (US)

(73) Assignee: Tripath Technology, Santa Clara, CA (US)

(*) Notice: Subject to any disclaimer, the term of this patent is extended or adjusted under 35 U.S.C. 154(b) by 0 days.

(21) Appl. No.: 09/759,005

(22) Filed: Jan. 11, 2001

Related U.S. Application Data

(63) Continuation of application No. 09/432,296, filed on Nov. 2, 1999.
(60) Provisional application No. 60/123,550, filed on Mar. 9, 1999.

(51) Int. Cl.[7] ............................. H03F 21/00; H03F 1/36; H03F 3/217
(52) U.S. Cl. ...................... 330/207 A; 330/107; 330/251
(58) Field of Search .................................... 330/107, 109, 330/51, 124 R, 10, 251, 207 A, 294, 302, 306

(56) References Cited

U.S. PATENT DOCUMENTS

| | | | |
|---|---|---|---|
| 5,077,539 | 12/1991 | Howatt | 330/10 |
| 5,329,245 | 7/1994 | Hammond et al. | 330/251 |
| 5,352,986 | 10/1994 | Modgil et al. | 330/107 |
| 5,479,337 | * 12/1995 | Voigt | 330/10 |
| 5,559,467 | * 9/1996 | Smedley | 330/10 |
| 5,805,020 | 9/1998 | Danz et al. | 330/10 |
| 5,949,296 | 10/1999 | Jacobson | 330/251 |
| 5,973,556 | 10/1999 | Su | 330/10 |
| 5,974,089 | * 10/1999 | Tripathi et al. | 330/207 A |

* cited by examiner

*Primary Examiner*—Robert Pascal
*Assistant Examiner*—Patricia T. Nguyen
(74) *Attorney, Agent, or Firm*—Beyer Weaver & Thomas, LLP

(57) ABSTRACT

A signal processing circuit and method for processing an input signal are described. The circuit includes a frequency selective network, an amplification stage, and at least one continuous-time feedback path from the output of the amplification stage to the frequency selective network. The amplification stage includes a switching amplifier and an analog amplifier. Switching circuitry alternately enables the switching and analog amplifiers for processing of the input signal.

28 Claims, 4 Drawing Sheets

METHODS AND APPARATUS FOR NOISE SHAPING A MIXED SIGNAL POWER OUTPUT

RELATED APPLICATION DATA

The present application is a continuation of U.S. patent application Ser. No. 09/432,296 for METHODS AND APPARATUS FOR NOISE SHAPING A MIXED SIGNAL POWER OUTPUT filed on Nov. 2, 1999, which claims priority from U.S. Provisional Patent Application No. 60/123,550 for METHODS AND APPARATUS FOR NOISE SHAPING A MIXED SIGNAL POWER OUTPUT filed on Mar. 9, 1999, the entire disclosures of which are incorporated herein by reference for all purposes.

BACKGROUND OF THE INVENTION

The present invention relates to signal processing techniques for providing high fidelity signal amplification. More specifically, the present invention provides techniques by which mixed signal amplification is employed with noise-shaping to generate an output signal with very low distortion.

Both switching and analog amplifiers have applications for which they are considered preferable. For example, because of power dissipation advantages, switching amplifiers are often employed for applications in which the fidelity of the output signal is not the greatest concern. That is, switching amplifiers generally exhibit lower power dissipation when outputting power of an appreciable level, but do not typically match the fidelity of analog amplifiers. Exceptions to this general rule are switching amplifiers provided by Tripath Technology Inc. of Santa Clara, Calif. Signal degradation due to increased harmonic distortion becomes especially pronounced for both switching and analog amplifiers as the output signal swing approaches the power supply rails, although some analog techniques allow rail-to-rail operation. The graph of FIG. 1 illustrates the effect of output signal swing on the total harmonic distortion of a typical switching amplifier.

The advantages of lower power dissipation are well known and include such things as, for example, smaller heat sinks and power supplies, reduced battery drain and operating temperature, and smaller product size. These significant advantages have led to the widespread use of switching amplifiers in a variety of applications. However, despite the design of some analog amplifiers, there are circumstances in which an analog amplifier may be designed with significantly less power dissipation than an equivalent switching amplifier, e.g., a class AB amplifier with a small bias. This typically occurs at or near quiescence, i.e., when there is little or no input signal but the amplifier remains active. This is due to the fact that, at quiescence, a switching amplifier must still produce a large switching voltage signal while an analog amplifier can "rest." Thus, for applications in which there is a considerable amount of idle or low power time, the use of analog amplifiers may be preferable. Of course, if the output swing for such an application at any time exceeds a certain level, and thus the power dissipation of the analog amplifier exceeds that of a comparable switching amplifier, the size of the heat sink and power supply must still be such that they could support such a power level on a consistent basis and these advantages are not realized. Furthermore, when a low bias is used, distortion problems can be exacerbated.

One approach to solving this dilemma will now be discussed with reference to the block diagram of FIG. 2. According to this technique, analog amplifier 202 is employed when there is little or no input signal to take advantage of its low quiescent current. When the output signal swing reaches a certain level, switching amplifier 204 is employed to take advantage of its lower power dissipation for higher output power levels.

Unfortunately, the approach of FIG. 2 is not feasible for high fidelity applications in which only very low levels of distortion are acceptable. This is because of the distortion in the output signal introduced by the transition between the analog and switching amplifiers. Moreover, such an approach does not address the fact that the fidelity of switching amplifiers drops off dramatically as the output signal swing approaches the power supply rails. In addition, with such an approach, the distortion of the analog amplifier goes uncorrected.

It is therefore desirable to provide a signal processing technique which exhibits the advantages of both switching and low power, high-signal-swing analog amplifiers while maintaining low distortion levels for high fidelity applications.

SUMMARY OF THE INVENTION

According to the present invention, methods and apparatus are provided by which switching and analog signal processing techniques are combined in a signal processing circuit to provide lower power dissipation, increased dynamic range, and lower distortion during different modes of operation. The signal processing circuit of the present invention has both a switching amplifier and an analog amplifier in its power stage which alternate operation depending on the level of the input signal.

When there is little or no signal input, i.e., quiescent or near-quiescent conditions, the analog amplifier is enabled thereby resulting in lower power dissipation by taking advantage of the fact that analog amplifiers typically have lower quiescent currents than switching amplifiers.

However, when the input signal reaches a threshold value, the analog amplifier is disabled and the switching amplifier is enabled to take advantage of the fact that, during periods in which the circuit is outputting power above a certain level, the power dissipation in switching amplifiers is lower than in equivalent analog amplifiers.

According to a specific embodiment, when the input signal level is such that the output of the amplification stage is approaching the power supply rails, the switching amplifier is disabled and the analog amplifier is enabled to take advantage of the lower distortion characteristics of the analog amplifier at such signal levels. This also takes advantage of the fact that, due to the low voltage drop across the output transistors, power dissipation at these signal levels again drops to a level similar to that of a comparable switching amplifier. In this way, various embodiments of the invention enjoy the advantages of both switching and analog signal processing techniques during different stages of operation of the signal processing circuit.

According to a specific embodiment, switching artifact due to the transition between the switching and analog amplifiers is minimized because the signal processing circuit is configured in a feedback loop which employs noise shaping techniques which push the transition distortion out of the band of interest. More specifically, the continuous-time output of the signal processing circuit is fed back to a frequency selective network in the loop for noise and distortion correction. This allows the technique of alternately enabling switching and analog amplifiers to be used even in applications where extremely high fidelity is required. In addition, the fidelity of the output signal during operation of both the switching and analog amplifiers is much higher than a typical switching amplifier or a typical low-power analog amplifier because of the noise shaping introduced by the frequency selective network and the continuous-time feedback.

Thus, according to a specific embodiment, the present invention provides a signal processing circuit which includes a frequency selective network, an amplification stage coupled to the frequency selective network, and at least one continuous-time feedback path from the output terminal of the amplification stage to the frequency selective network. The amplification stage comprises a switching amplifier and an analog amplifier. Switching circuitry alternately enables the switching and analog amplifiers for processing of an input signal.

According to another specific embodiment, the present invention provides a method for processing an input signal using a signal processing circuit which includes a frequency selective network, an amplification stage having a switching amplifier and an analog amplifier, and at least one continuous-time feedback path from the output terminal of the amplification stage to the frequency selective network. The input signal is monitored to determine an input signal level. A noise characteristic associated with the input signal is shaped using the frequency selective network and feedback from the continuous-time feedback path. For a first input signal level, the input signal is processed with the analog amplifier. For a second input signal level, the input signal is processed with the switching amplifier. According to one embodiment, the first signal level is below a threshold and the second signal level is above the threshold. According to a second embodiment, the first signal level is above a threshold and the second signal level is below the threshold.

According to yet another specific embodiment, the present invention provides a method for processing an input signal using a signal processing circuit which includes an amplification stage having a switching amplifier and an analog amplifier. The input signal is monitored to determine an input signal level. Where the input signal level is below a first threshold level, the input signal is processed with the analog amplifier. Where the input signal level exceeds a second threshold level, the input signal is processed with the analog amplifier. Where the input signal level is between the first and second thresholds, the input signal is processed with the switching amplifier.

A further understanding of the nature and advantages of the present invention may be realized by reference to the remaining portions of the specification and the drawings.

DESCRIPTION OF SPECIFIC EMBODIMENTS

Figure 1:
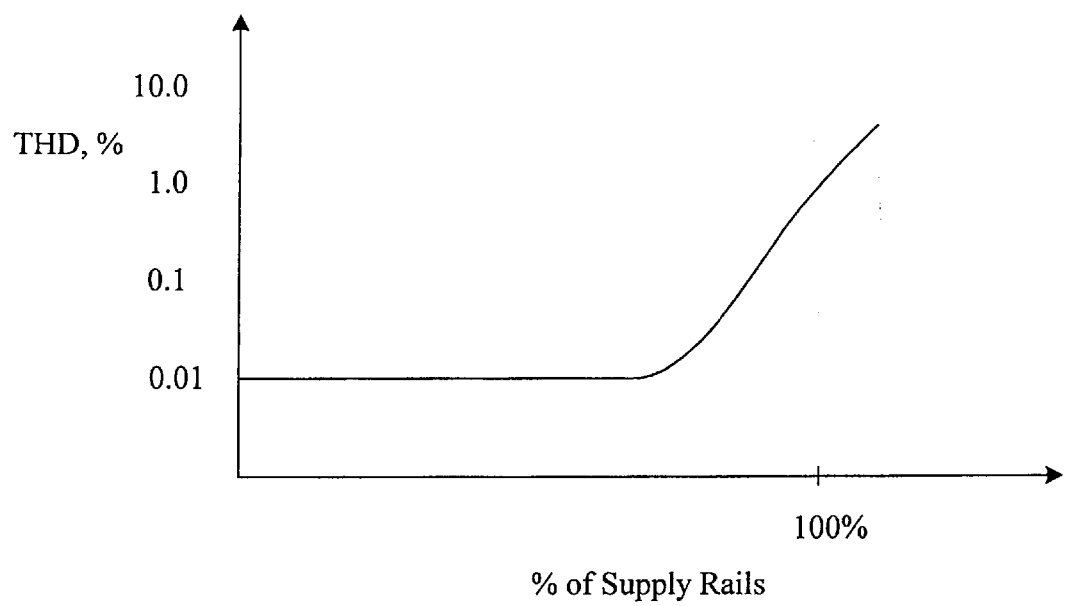
FIG. 1 is a graph illustrating the distortion characteristic of a typical switching amplifier.
Figure 2:
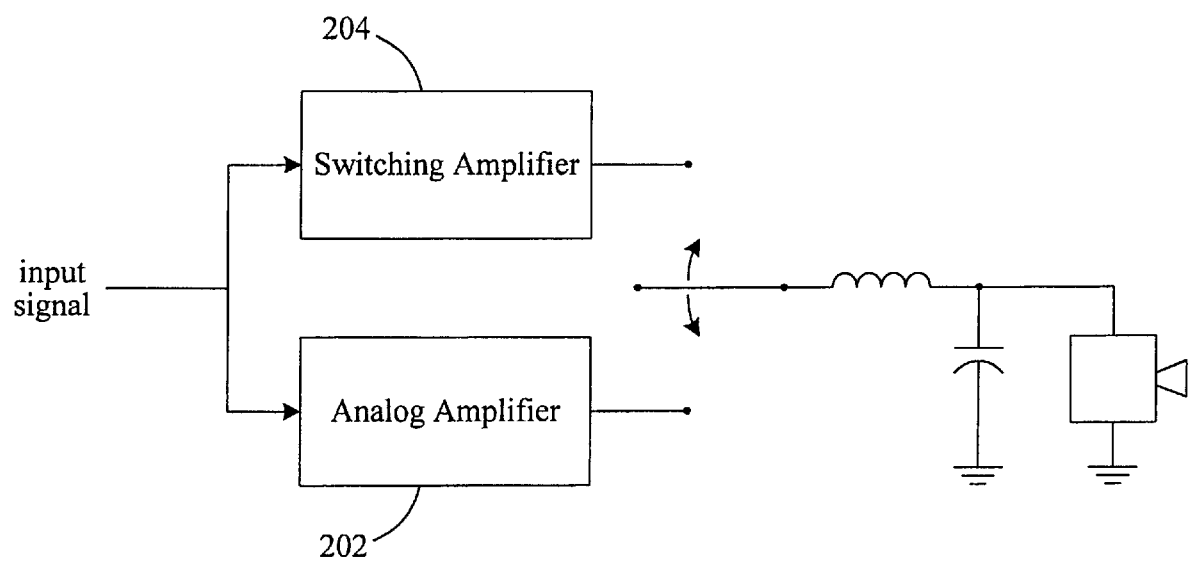
FIG. 2 is a block diagram of a mixed-signal amplifier designed according to the prior art.
Figure 3:
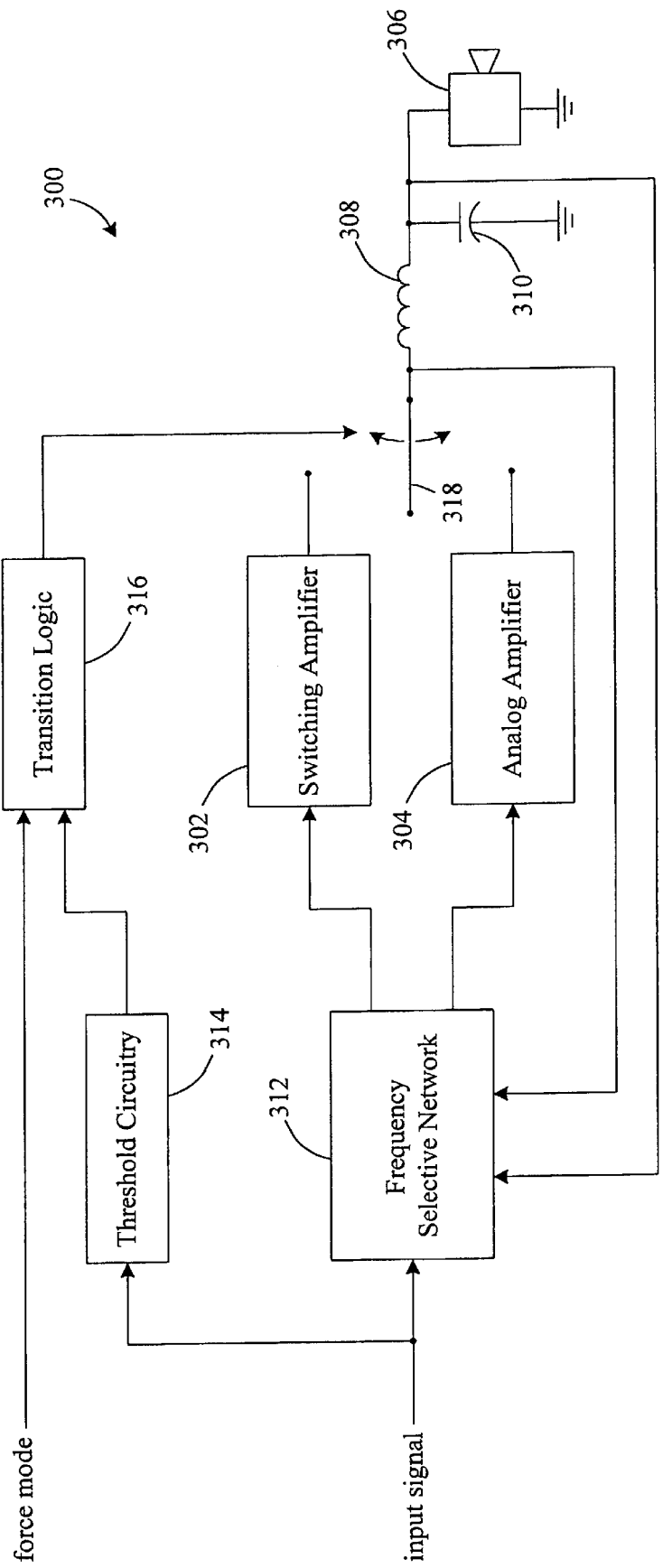
FIG. 3 is a block diagram of a signal processing circuit designed according to a specific embodiment of the invention.

FIG. 3 is a block diagram of a signal processing circuit 300 designed according to a specific embodiment of the invention. Circuit 300 includes an amplification stage which alternates between a switching amplifier 302 and an analog amplifier 304 during different modes of operation to drive a load 306 via an LC filter comprising inductor 308 and capacitor 310. Amplifiers 302 and 304 are included in a feedback loop which also includes a frequency selective network 312 for noise shaping purposes. The noise shaping characteristics of frequency selective network 312 result in a very low level of distortion in the output signal regardless of which of the two amplifiers are enabled. The noise shaping also minimizes the undesirable distortion components contributed by the transition between switching amplifier 302 and analog amplifier 304.

Frequency selective network 312 may comprise a wide variety of noise shaping circuit topologies. Some examples of a frequency selective network for use with the present invention are described in commonly assigned U.S. Pat. No. 5,777,512 for METHOD AND APPARATUS FOR OVERSAMPLED, NOISE-SHAPING, MIXED-SIGNAL PROCESSING issued Jul. 7, 1998, the entire disclosure of which is incorporated herein by reference for all purposes. In addition, other noise shaping frequency selective networks may be employed with the present invention such as, for example, sigma-delta modulators, as described by H. Ballan and M. Declercq in 12 V ΣΔClass-D Amplifier in 5V CMOS Technology, pp. 559–562 (IEEE 1995 Custom Integrated Circuit Conference), the entirety of which is incorporated herein by reference for all purposes. For a thorough discussion of sigma-delta modulation techniques, see also Candy and Temes, *Oversampling Delta-Sigma Data Converters*, pp. 1–25 (IEEE Press, 1992), the entirety of which is incorporated herein by reference for all purposes. A specific embodiment of a frequency selective network which may be employed with the present invention is also discussed below with reference to FIG. 5.

It should be noted that the feedback path from the output of the LC filter (inductor 308 and capacitor 310) to frequency selective network 312 is not necessary for implementation of the present invention and may be omitted. In addition, compensation for loop delays introduced by the amplifier stages and/or the LC filter may be achieved using the techniques described in U.S. Pat. No. 5,909,153 for METHOD AND APPARATUS FOR COMPENSATING FOR DELAYS IN MODULATOR LOOPS issued on Jun. 1, 1999, the entire disclosure of which is incorporated herein by reference for all purposes.

Figure 4:
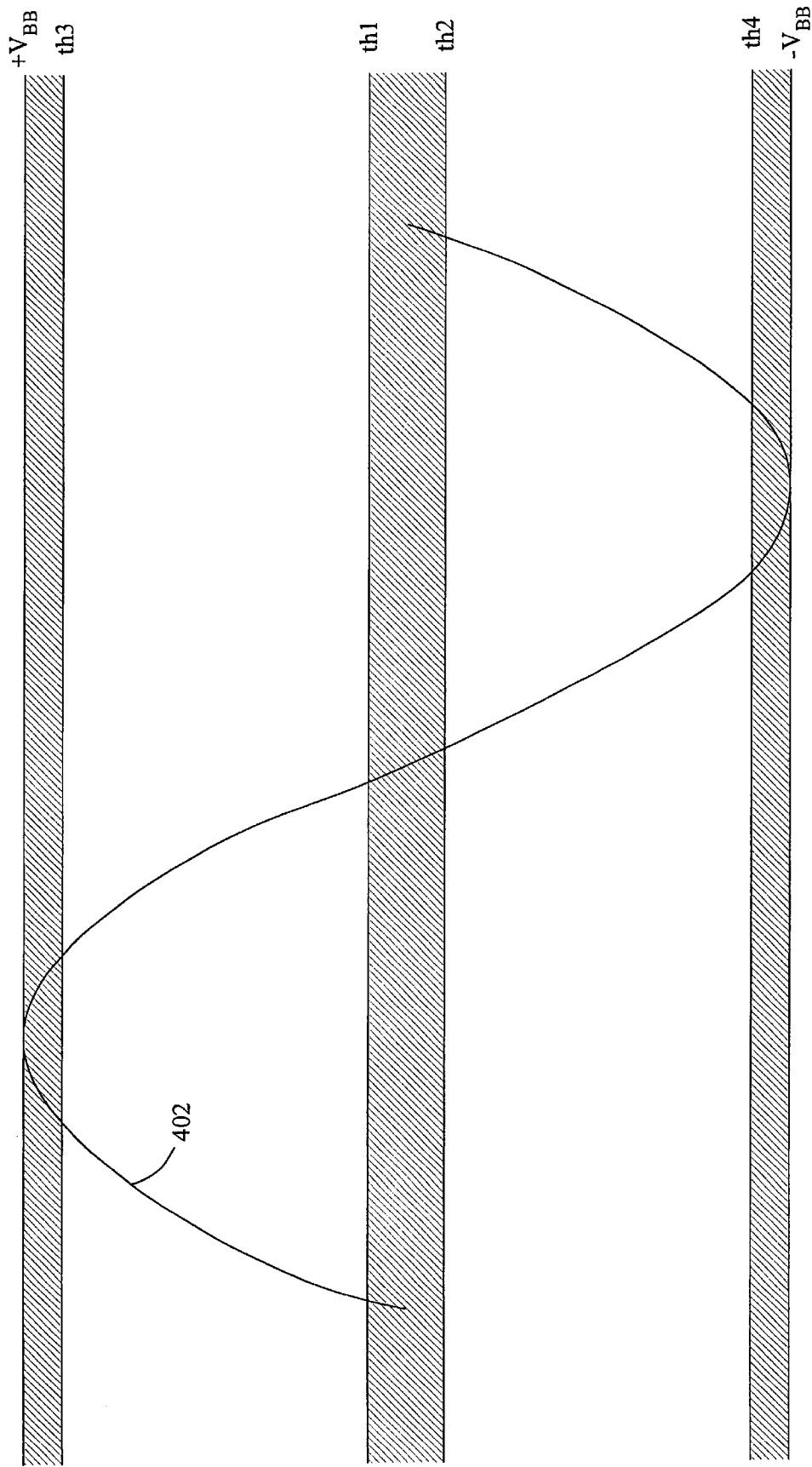
FIG. 4 is a graph illustrating zones of operation of a signal processing circuit according to a specific embodiment of the invention.

The operation of signal processing circuit 300 according to a specific embodiment of the invention will now be described with reference to FIG. 4. The graph of FIG. 4 illustrates different modes of operation of signal processing circuit 300 with reference to the magnitude of an output signal 402. While output signal 402 stays within thresholds th1 and th2, analog amplifier 304 is enabled and used to drive load 306. As discussed above, the analog amplifier is used in this near-quiescence region to take advantage of its lower quiescent current. The frequency selective network is used to achieve high linearity. The dead time of the crossover distortion is kept small to ensure stability. Also, adequate gain is used in the analog amplifier stage to ensure stability.

According to a specific embodiment of the invention, the level of the output signal is determined by monitoring the level of the input signal with threshold circuitry 314, the output of which is then used by transition logic circuitry 316 to effect the transition between switching amplifier 302 and analog amplifier 304 by means of switching circuitry 318. According to one embodiment, transition logic circuitry 316 also receives a "force mode" input signal which can force one or the other amplifier to be enabled at all times regardless of the level of the input or output signal. According to a more specific embodiment, the force mode signal is a tri-state signal with one state which enables switching amplifier 302 for all signal levels, one state which enables analog amplifier 304 for all signal levels, and a third state which allows for multi-mode operation.

According to another embodiment, the force mode input signal is used to trigger a pure analog mode in which analog amplifier 304 is enabled at all times and signal processing circuit 300 operates in a purely analog manner. In the pure analog mode, because the noise shaping properties of frequency selective network 312 greatly reduce the distortion products of the nonlinear output stages over traditional analog feedback loops, the bias current required for the analog amplifier is correspondingly reduced. Such a pure analog mode may be useful, for example, for the reduction of electromagnetic interference (EMI). An example of such an application is an amplifier which is used for AM/FM radio reception. In such an application, the switching amplifier would interfere with the AM radio.

During multi-mode operation, when the swing of signal 402 exceeds thresholds th1 and th2 but has not yet reach thresholds th3 and th4, operation of switching amplifier 302 is enabled. This takes advantage of the lower power dissipation of switching amplifier 302 during periods of appreciable power output. As mentioned above, the fidelity of the output signal is maintained at a very high level through the use of frequency selective network 312 and continuous-time feedback. In addition, this noise shaping minimizes the effect of the transition from analog to switching operation by pushing the transition distortion out of the band of interest. Thus, at least until the signal swing approaches the power supply rail, the distortion levels for both the analog and switching operation remain very low providing the transition is made with minimal delay).

When the output signal swing approaches the power supply rails, the distortion levels associated with switching amplifier 302 begin to climb. Therefore, when the magnitude of the output swing exceeds thresholds th3 and th4, switching amplifier 302 is disabled and analog amplifier 304 is once again enabled. This mode of operation takes advantage of the fact that analog amplifier 302 exhibits lower distortion at high signal levels than does switching amplifier 302. Again, distortion related to the switching artifact is pushed out of the band of interest by the noise shaping characteristics of frequency selective network 312 and the continuous-time feedback.

Threshold circuitry 314 and transition logic 316 may be implemented in a variety of ways which will be understood by those skilled in the art. Therefore the details of their implementation are not discussed here. It will also be understood that triggering of the different modes of operation may be accomplished by monitoring other points in the feedback loop of signal processing circuit 300 instead of the input signal. For example, the output signal may be monitored at load 306. Further, either analog mode may be removed while still retaining the benefits of the other analog mode. Therefore, the scope of the attached claims should not be considered to be limited by the disclosed embodiments.

Figure 5:
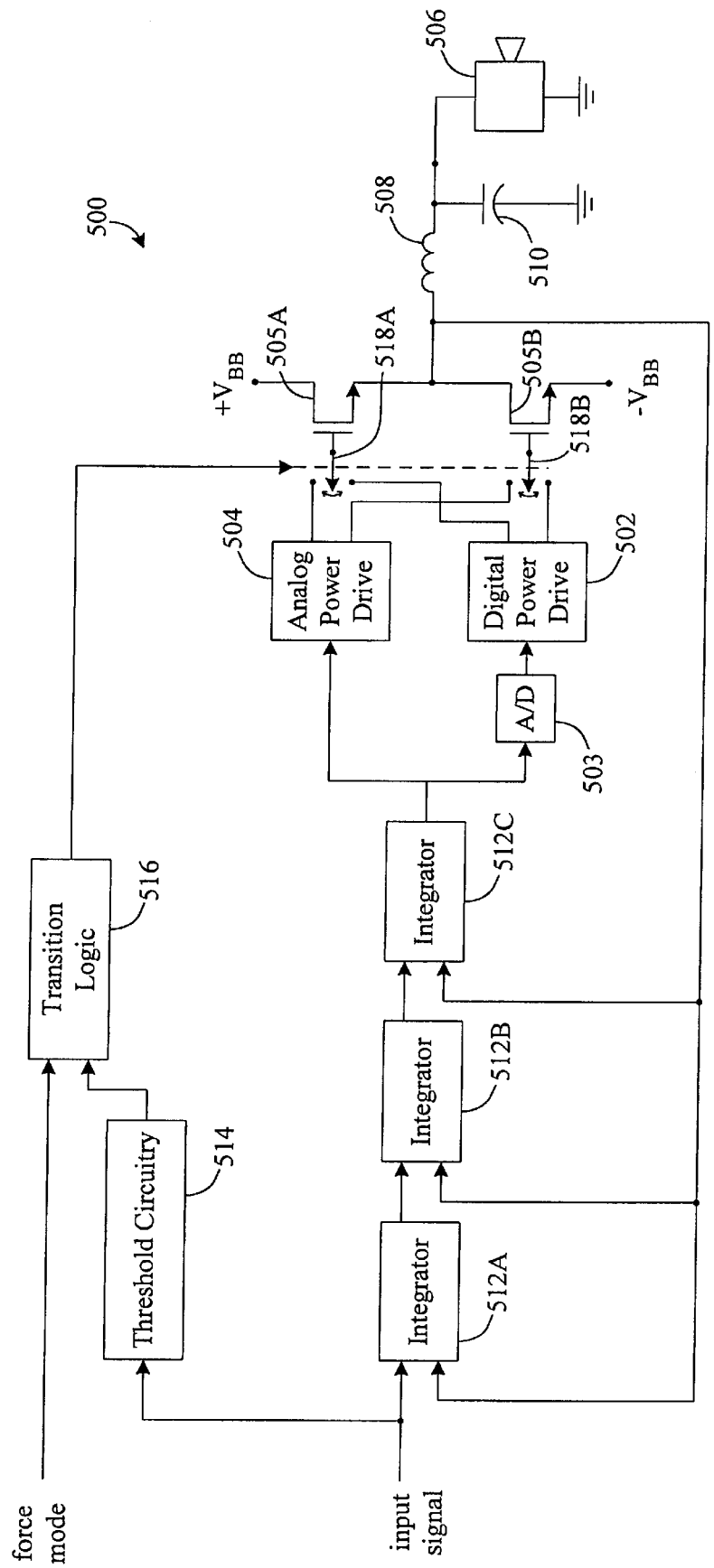
FIG. 5 is a block diagram of a signal processing circuit designed according to a more specific embodiment of the invention.

FIG. 5 is a block diagram of a signal processing circuit 500 designed according to a more specific embodiment of the invention. In this embodiment, a specific implementation of the frequency selective network of FIG. 3 is shown. The amplification stage of circuit 500 alternates between digital power drive circuit 502 and analog power drive circuit 504 which drive transistors 505A and 505B via switches 518A and 518B during different modes of operation. The amplification stage, in turn drives load 506 via an LC filter comprising inductor 508 and capacitor 510. The frequency selective network of circuit 500 comprises integrators 512A, 512B, and 512C. A clocked comparator stage 503 sampled at sample frequency $f_s$, receives the output of the final integrator stage and transmits the resulting logic signal to digital power drive circuit 502 for switching mode operation. It should be noted that the present technique may be implemented with non-clocked schemes including, for example, pulse width modulation (PWM) techniques.

Continuous-time feedback is provided to each of the integrators as shown. In a specific embodiment, an anti-aliasing filter is not employed in the feedback path because the integrator stages are continuous-time integrators which inherently reject high frequencies. In another embodiment, the integrators are sampled integrators and the feedback is provided via an anti-aliasing filter. Such a filter would typically be a low pass filter which reduces the aliasing effects of the high frequency distortion generated by the power switching stage by removing the high frequency distortion from the continuous-time feedback signal. For additional details regarding continuous-time feedback with sampled integrators, please refer to the above-referenced patent.

It should also be noted that while the frequency selective network of FIG. 5 is a third-order circuit, higher or lower order circuits may be employed to implement the present invention. That is, for example, a second-order frequency selective network having two integrator stages may be used to implement the invention. In addition, it will be understood that the techniques described herein may be employed equally well for band pass applications. In such an embodiment, the integrator stages may be replaced by some other type of frequency selective network such as, for example, resonator stages.

According to a specific embodiment of the invention, the level of the output signal is determined by monitoring the level of the input signal with threshold circuitry 514, the output of which is then used by transition logic circuitry 516 to effect the transition between digital power drive 502 and analog power drive 504 by means of switches 518A and 518B. According to one embodiment, transition logic circuitry 516 also receives a "force mode" input signal which can force one or the other amplifier to be enabled at all times regardless of the level of the input or output signal. According to a more specific embodiment, the force mode signal is a tri-state signal with one state which enables digital power drive 502 for all signal levels, one state which enables analog power drive 504 for all signal levels, and a third state which allows for multi-mode operation.

As discussed above with reference to the threshold circuitry and transition logic of FIG. 3, threshold circuitry 514 and transition logic 516 may be implemented in a variety of ways which will be understood by those skilled in the art. Therefore the details of their implementation are not discussed here. It will also be understood that triggering of the digital and analog modes of operation may be accomplished by monitoring other points in the feedback loop of signal processing circuit 500 instead of the input signal. For example, the output signal may be monitored at load 506. Therefore, the scope of the attached claims should not be considered to be limited by the disclosed embodiments.

While the invention has been particularly shown and described with reference to specific embodiments thereof, it will be understood by those skilled in the art that changes in the form and details of the disclosed embodiments may be made without departing from the spirit or scope of the invention. For example, the operation of a specific embodiment of the invention is described as having two zones of operation in which the analog amplifier is enabled, i.e., near quiescence and near the power supply rails. It should be understood, however, that certain embodiments of the invention may have more or fewer such zones of operation without departing from the scope of the invention. That is, an embodiment in which the analog amplifier only operates near the power supply rails or only near quiescence may be within the scope of the invention. Therefore, the scope of the invention should be determined with reference to the appended claims.

What is claimed is:

1. A signal processing circuit for processing an input signal, comprising:
    a frequency selective network;
    an amplification stage coupled to the frequency selective network, the amplification stage comprising a switching amplifier, an analog amplifier, and an output terminal;
    at least one continuous-time feedback path from the output terminal of the amplification stage to the frequency selective network; and
    switching circuitry for alternately enabling the switching and analog amplifiers for processing of the input signal, the switching circuitry comprising level detection circuitry for monitoring a signal level indicative of the input signal, and wherein the switching circuitry is configured to alternately enable the switching and analog amplifiers in response to the signal level such that where the signal level is below a first threshold level the input signal is processed with the analog amplifier, and where the signal level is above the first threshold level the input signal is processed with the switching amplifier.

2. The signal processing circuit of claim 1 wherein the first threshold level is associated with a quiescence region for the signal processing circuit.

3. The signal processing circuit of claim 1 wherein the switching circuitry is further configured to alternately enable the switching and analog amplifiers in response to the signal level such that where the signal level exceeds a second threshold level the input signal is processed with the analog amplifier, and where the signal level is between the first and second thresholds the input signal is processed with the switching amplifier.

4. The signal processing circuit of claim 3 wherein the second threshold level is associated with a power supply rail associated with the signal processing circuit.

5. The signal processing circuit of claim 1 wherein the amplification stage is configured for base band operation and the frequency selective network comprises at least one integrator stage.

6. The signal processing circuit of claim 5 wherein the amplification stage is configured for audio amplification.

7. The signal processing circuit of claim 1 wherein the amplification stage is configured for band pass operation and the frequency selective network comprises at least one resonator stage.

8. The signal processing circuitry of claim 1 wherein the switching circuitry further comprises force mode circuitry for forcing use of one of the switching amplifier and analog amplifier regardless of the signal level.

9. The signal processing circuitry of claim 8 wherein the force mode circuitry forces use of the switching amplifier regardless of the signal level in a first mode, forces use of the analog amplifier regardless of the signal level in a second mode, and allows alternate enablement of the switching and analog amplifier in response to the signal level in a third mode.

10. The signal processing circuitry of claim 1 wherein the level detection circuitry is configured to monitor the signal level at a node associated with the frequency selective network.

11. The signal processing circuitry of claim 1 wherein the level detection circuitry is configured to monitor the signal level at a node associated with the amplification stage.

12. The signal processing circuitry of claim 1 wherein the level detection circuitry is configured to monitor the signal level at a node associated with the at least one continuous-time feedback path.

13. The signal processing circuitry of claim 1 wherein the frequency selective network is configured to push transition distortion associated with alternate enablement of the switching and analog amplifiers out of a band of operation of the signal processing circuit.

14. A signal processing circuit for processing an input signal, comprising:
    a frequency selective network;
    an amplification stage coupled to the frequency selective network, the amplification stage comprising a switching amplifier, an analog amplifier, and an output terminal;
    at least one continuous-time feedback path from the output terminal of the amplification stage to the frequency selective network; and
    switching circuitry for alternately enabling the switching and analog amplifiers for processing of the input signal, the switching circuitry comprising level detection circuitry for monitoring a signal level indicative of the input signal, and wherein the switching circuitry is configured to alternately enable the switching and analog amplifiers in response to the signal level such that where the signal level is above a first threshold level the input signal is processed with the analog amplifier, and where the signal level is below the first threshold level the input signal is processed with the switching amplifier.

15. The signal processing circuit of claim 14 wherein the first threshold level is associated with a power supply rail associated with the signal processing circuit.

16. The signal processing circuit of claim 14 wherein the switching circuitry is further configured to alternately enable the switching and analog amplifiers in response to the signal level such that where the signal level is below a second threshold level the input signal is processed with the analog amplifier, and where the signal level is between the first and second thresholds the input signal is processed with the switching amplifier.

17. The signal processing circuit of claim 16 wherein the second threshold level is associated with a quiescence region for the signal processing circuit.

18. The signal processing circuit of claim 14 wherein the amplification stage is configured for base band operation and the frequency selective network comprises at least one integrator stage.

19. The signal processing circuit of claim 18 wherein the amplification stage is configured for audio amplification.

20. The signal processing circuit of claim 14 wherein the amplification stage is configured for band pass operation and the frequency selective network comprises at least one resonator stage.

21. The signal processing circuitry of claim 14 wherein the switching circuitry further comprises force mode circuitry for forcing use of one of the switching amplifier and analog amplifier regardless of the signal level.

22. The signal processing circuitry of claim 21 wherein the force mode circuitry forces use of the switching amplifier regardless of the signal level in a first mode, forces use of the analog amplifier regardless of the signal level in a second mode, and allows alternate enablement of the switching and analog amplifier in response to the signal level in a third mode.

23. The signal processing circuitry of claim 14 wherein the level detection circuitry is configured to monitor the signal level at a node associated with the frequency selective network.

24. The signal processing circuitry of claim 14 wherein the level detection circuitry is configured to monitor the signal level at a node associated with the amplification stage.

25. The signal processing circuitry of claim 14 wherein the level detection circuitry is configured to monitor the signal level at a node associated with the at least one continuous-time feedback path.

26. The signal processing circuitry of claim 14 wherein the frequency selective network is configured to push transition distortion associated with alternate enablement of the switching and analog amplifiers out of a band of operation of the signal processing circuit.

27. An electronic device including the signal processing circuit of claim 1.

28. An electronic device including the signal processing circuit of claim 14.

* * * * *